United States Patent
Wang et al.

(10) Patent No.: US 12,206,041 B2
(45) Date of Patent: Jan. 21, 2025

(54) METHOD FOR MONOLITHIC INTEGRATION PREPARATION OF FULL-COLOR NITRIDE SEMICONDUCTOR MICRO LIGHT-EMITTING DIODE ARRAY

(71) Applicant: PEKING UNIVERSITY, Beijing (CN)

(72) Inventors: Xinqiang Wang, Beijing (CN); Fang Liu, Beijing (CN); Zhaoying Chen, Beijing (CN); Yucheng Guo, Beijing (CN); Bowen Sheng, Beijing (CN); Duo Li, Beijing (CN); Bo Shen, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 18/561,697

(22) PCT Filed: Aug. 9, 2022

(86) PCT No.: PCT/CN2022/111052
§ 371 (c)(1),
(2) Date: Nov. 16, 2023

(87) PCT Pub. No.: WO2024/021158
PCT Pub. Date: Feb. 1, 2024

(65) Prior Publication Data
US 2024/0429343 A1    Dec. 26, 2024

(30) Foreign Application Priority Data
Jul. 27, 2022  (CN) ............................. 202210888388

(51) Int. Cl.
*H01L 33/00*     (2010.01)
*H01L 25/075*    (2006.01)

(52) U.S. Cl.
CPC ........ *H01L 33/007* (2013.01); *H01L 25/0753* (2013.01); *H01L 33/0095* (2013.01); *H01L 2933/0016* (2013.01)

(58) Field of Classification Search
CPC .............. H01L 33/007; H01L 25/0753; H01L 33/0095; H01L 2933/0016
See application file for complete search history.

(56) References Cited

U.S. PATENT DOCUMENTS

2022/0231202 A1* 7/2022 Cheng ................... H01L 33/502
2022/0271159 A1* 8/2022 Kocon ................ H01L 29/0834

FOREIGN PATENT DOCUMENTS

| CN | 101958333 A | 1/2011 |
| CN | 110212068 A | 9/2019 |
| KR | 20210103025 A | 8/2021 |

OTHER PUBLICATIONS

International Search Report issued in International Application No. PCT/CN2022/111052, mailed on Mar. 9, 2023.
(Continued)

*Primary Examiner* — Ratisha Mehta
(74) *Attorney, Agent, or Firm* — Knobbe, Martens, Olson & Bear, LLP

(57) ABSTRACT

Disclosed is a method for monolithic integration preparation of a full-color nitride semiconductor micro light-emitting diode (micro-LED) array. The method includes preparing a composite conductive substrate; overlaying an insulating template onto the composite conductive substrate to prepare a template substrate; overlaying monocrystalline graphene onto the template substrate in a completely aligned manner to obtain a customized template graphene substrate including graphene array units, wherein one blue-region graphene array element, one green-region graphene array element, and two red-region graphene array elements in each graphene array unit have surface properties different from each other;

(Continued)

then performing an in-situ process to epitaxially grow a vertical-structure all-nitride material, to obtain a full-color micro-LED array epitaxial wafer by one-step in-situ process; finally, performing packaging and preparing a transparent electrode, to obtain a vertical-structure full-color nitride micro-LED array with top light emission.

10 Claims, 4 Drawing Sheets

(56) References Cited

OTHER PUBLICATIONS

Notification to Grant Patent Right for Invention issued in in Chinese Patent Application No. 202210888388, dated Sep. 6, 2022.

\* cited by examiner

Preparing a composite conductive substrate, which includes an n-type conductive monocrystalline silicon wafer and a transparent insulating substrate

Providing an insulating template, in which each of the through-hole units includes one green-light region through hole, one blue-light region through hole, and two red-light region through holes

Overlaying the insulating template onto the composite conductive substrate in a completely aligned manner to prepare a template substrate, in which areas corresponding to the through holes are conductive regions

Overlaying monocrystalline graphene onto the template substrate in a completely aligned manner, performing modification processing to obtain a customized template graphene substrate in which blue-region graphene array elements, green-region graphene array elements, and red-region graphene array elements have surface properties different from each other

Performing one-step in-situ process to epitaxially grow vertical-structure all-nitride micro-LEDs, to obtain a full-color micro-LED array epitaxial wafer by one-step in-situ process

Performing packaging by in-situ passivation and filling gaps in the full-color micro-LED array by using an in-situ total internal reflection metal packaging technology, to obtain a flat full-color micro-LED array wafer

Preparing a transparent electrode and bonding with a drive circuit board to obtain a vertical-structure full-color nitride micro-LED array with top light emission

FIG. 6

METHOD FOR MONOLITHIC INTEGRATION PREPARATION OF FULL-COLOR NITRIDE SEMICONDUCTOR MICRO LIGHT-EMITTING DIODE ARRAY

CROSS REFERENCE TO RELATED APPLICATIONS

The present application is a national stage application of International Patent Application No. PCT/CN2022/111052, filed on Aug. 9, 2022, which claims priority to Chinese Patent Application No. 202210888388.8, entitled "Method for monolithic integration preparation of full-color nitride semiconductor micro light-emitting diode array" and filed with the China National Intellectual Property Administration on Jul. 27, 2022. The disclosure of each of these patent applications is incorporated herein by references herein in its entirety.

TECHNICAL FIELD

The present disclosure relates to the fabrication technology of nitride semiconductor light-emitting devices, and in particular to a method for monolithic integration preparation of a full-color nitride semiconductor micro light-emitting diode (micro-LED) array.

BACKGROUND

Micro-LED chips, characterized by a small size, a high integration level, and self-emitting properties, offer significant advantages over liquid crystal displays (LCD) and organic light-emitting diodes (OLED) in terms of brightness, resolution, contrast, energy efficiency, lifespan, response speed, and thermal stability, and have important applications in fields such as solid-state lighting, smart displays, sensing and detection.

Currently, the industry mainly relies on two technologies for preparing red-green-blue full-color micro-LEDs: massive transfer and monolithic integration based on quantum dot deposition. In both approaches. LED chips are required to be prepared into micro-LED devices by micro-nano processing. The difference lies in that: the massive transfer technology involves transferring nitride blue and green-light-emitting micro-LEDs and phosphide red-light-emitting micro-LEDs from epitaxial substrates to drive circuit boards and arranging the micro-LEDs according to a specific rule to achieve full-color display; while the monolithic integration based on quantum dot deposition involves depositing quantum dots with color conversion functionality on a nitride ultraviolet micro-LED array according to a specific rule, to achieve red-green-blue full-color display through drive circuits. The above technologies have two main bottlenecks: Firstly, the fabricated micro-LED components have a horizontal structure with both n-type and p-type electrodes at the same side: the device size needs to be larger than 10 μm to meet the reliability requirements of electrode processing, resulting in low electro-optical conversion efficiency and inability to meet the small size and high light efficiency requirements on micro-LED devices in situations such as virtual reality/augmented reality. Secondly, during preparation of a full-color micro-LED display array, there are issues related to material incompatibility between nitride and phosphide, and between semiconductor and organic quantum dots, making the process complex, energy-inefficient, technically challenging, and with a low yield.

SUMMARY

To address the foregoing problems in the prior art, the present disclosure provides a method for monolithic integration preparation of a full-color nitride semiconductor micro-LED array.

The method for monolithic integration preparation of a full-color nitride semiconductor micro-LED array according to the present disclosure includes the following steps:
1) preparing a composite conductive substrate, comprising:
  1-a) providing a transparent insulating substrate, wherein a material for the transparent insulating substrate has a bandgap greater than 5.0 eV and does not absorb ultraviolet light with a wavelength greater than 250 nm; and
  1-b) providing an n-type conductive monocrystalline silicon wafer with a resistivity less than 0.01 ohm cm: performing polishing on one side of the n-type conductive monocrystalline silicon wafer to form a polished surface, thinning a non-polished surface of the n-type conductive monocrystalline silicon wafer, and attaching the n-type conductive monocrystalline silicon wafer onto the transparent insulating substrate, with the polished surface facing upwards, to form the composite conductive substrate, wherein an outer periphery of the n-type conductive monocrystalline silicon wafer has a same shape as an outer periphery of the transparent insulating substrate:
2) providing an insulating template, wherein the insulating template is a flat panel made of an electrically insulating material: an outer periphery of the insulating template has a same shape as an outer periphery of the composite conductive substrate: the insulating template is divided into a plurality of through hole units that are arranged closely in a two-dimensional manner: an outer periphery of each of the through hole units is in a plane shape of square: each of the through hole units comprises four circular through holes inside with a depth equal to a thickness of the insulating template, namely, one green-light region through hole, one blue-light region through hole, and two red-light region through holes: the green-light region through bole and the blue-light region through hole are respectively located at a pair of diagonal corners of the square, and the two red-light region through holes are respectively located at the other pair of diagonal corners of the square;
3) preparing a template substrate, comprising:
  3-a) overlaying the insulating template onto the composite conductive substrate in a completely aligned manner;
  3-b) preparing a protective layer on the insulating template, such that the protective layer is formed on the n-type conductive monocrystalline silicon wafer in areas corresponding to the circular through holes of the insulating template, while no protective layer is formed in areas not corresponding to the circular through holes of the insulating template;
  3-c) removing the insulating template, and performing ion implantation on the n-type conductive monocrystalline silicon wafer, such that ions are implanted into the areas of the n-type conductive monocrystalline silicon wafer which are not covered by the protective layer, thereby increasing resistivity and making the areas electrically insulating;
  3-d) performing chemical cleaning on the composite conductive substrate after ion implantation to remove the protective layer, wherein the areas corresponding to the circular through holes of the insulating template remain conductive, while remaining areas become electrically insulating, thus completing modification of the n-type conductive monocrystalline silicon wafer to obtain the template substrate; and 3-e) corresponding to the insulating template, providing a plurality of pixel regions arranged closely in a two-dimensional manner on the n-type conductive monocrystalline silicon wafer of the template substrate, wherein each of the pixel regions comprises four circular conductive regions, namely, two red-light conductive regions, one green-light conductive region, and one blue-light conductive region, and the rest being an insulating region;

4) preparing a customized template graphene substrate, comprising 4-a) providing monocrystalline graphene, wherein an outer periphery of the monocrystalline graphene has a same shape as the template substrate, and the monocrystalline graphene has a thickness of 3 to 6 atomic layers;

4-b) overlaying the monocrystalline graphene onto the template substrate in a completely aligned manner;

4-c) overlaying the insulating template onto the monocrystalline graphene in a completely aligned manner, wherein the one green-light region through hole, the one blue-light region through hole, and the two red-light region through holes in each of the through hole units of the insulating template are respectively precisely aligned with the one green-light conductive region, the one blue-light conductive region, and the two red-light conductive regions in each of the pixel regions of the n-type conductive monocrystalline silicon wafer;

4-d) thinning the monocrystalline graphene in areas corresponding to blue-light region through holes and green-light region through holes, until the areas have a thickness of one atomic layer;

4-e) performing uniform nitrogen atom doping on the monocrystalline graphene in areas corresponding to the blue-light region through holes, the green-light region through holes, and red-light region through holes, wherein the monocrystalline graphene after the uniform nitrogen atom doping exhibits ultraviolet absorption within a range of 240 nm to 270 nm;

4-f) depositing an AlON layer on the monocrystalline graphene in areas corresponding to the blue-light region through holes, such that a nitride epitaxial layer grown thereon has a metal lattice polarity; and 4-g) cutting edges of the monocrystalline graphene that correspond to the blue-light region through holes, the green-light region through holes, and the red-light region through holes of the insulating template, wherein the cutting is performed only on the monocrystalline graphene; and removing the insulating template to obtain the customized template graphene substrate, wherein blue-region graphene array elements, green-region graphene array elements, and red-region graphene array elements are formed on the monocrystalline graphene in areas respectively corresponding to the blue-light region through holes, the green-light region through holes, and the red-light region through holes, and an insulating-region graphene array element is formed among the blue-region graphene array elements, the green-region graphene array elements, and the red-region graphene array elements, thereby forming graphene array units each comprising one blue-region graphene array element, one green-region graphene array element, two red-region graphene array elements, and an insulating-region graphene array element; and wherein the one blue-region graphene array element, the one green-region graphene array element, and the two red-region graphene array elements in each of the graphene array units on the n-type conductive monocrystalline silicon wafer of the customized template graphene substrate have surface properties different from each other;

5) preparing a full-color micro-LED array epitaxial wafer, comprising placing the customized template graphene substrate into a metal organic chemical vapor deposition system, epitaxially growing a vertical-structure all-nitride material on the customized template graphene substrate through one-step in-situ process, thereby obtaining the full-color micro-LED array epitaxial wafer through the one-step in-situ process, wherein a multiple quantum well (MQW) of the vertical-structure all-nitride material comprises multiple periods of InGaN potential wells and GaN potential barriers;

due to the different surface properties of the blue-region graphene array elements, the green-region graphene array elements, and the red-region graphene array elements on the customized template graphene substrate, vertical-structure all-nitride materials grown thereon have different lattice polarities, stress states, and In compositions in MQW structures, and thereby different central emission wavelengths, and therefore a vertical-structure monocrystalline metal-polar blue-light-emitting nitride, a vertical-structure monocrystalline nitrogen-polar green-light-emitting nitride, and a vertical-structure monocrystalline stress-relaxed nitrogen-polar red-light-emitting nitride are grown respectively on the blue-region graphene array elements, the green-region graphene array elements, and the red-region graphene array elements, to form a blue-light-emitting micro-LED, a green-light-emitting micro-LED, and a red-light-emitting micro-LED, as well as an area without micro-LEDs, which constitute a micro-LED pixel unit; and the blue-light-emitting micro-LED, the green-light-emitting micro-LED, and the red-light-emitting micro-LED are micrometer-sized pillars;

6) packaging, comprising providing sidewall protection for the full-color micro-LED array epitaxial wafer by using an in-situ passivation packaging technology, and filling gaps in the full-color micro-LED array by using an in-situ total internal reflection metal packaging technology, to obtain a flat full-color micro-LED array wafer; and 7) preparing a transparent electrode, comprising preparing the transparent electrode on a surface of the flat full-color micro-LED array wafer by using a mask deposition method, and bonding the flat full-color micro-LED array wafer onto a drive circuit board by using a bottom electrode bonding technology, to achieve a vertical-structure full-color nitride micro-LED array with top light emission.

In some embodiments, in step 1-a), the transparent insulating substrate is one selected from the group consisting of a sapphire substrate, a diamond substrate, and a gallium oxide substrate, and has a thickness ranging from 300 to 1500 μm.

In some embodiments, in step 1-b), the n-type conductive monocrystalline silicon wafer has a thickness ranging from 300 μm to 1500 μm and a diameter ranging from 50 mm to 300 mm; the polished surface of the n-type conductive monocrystalline silicon wafer has a surface roughness of less than 0.5 nm; and the non-polished surface of the n-type conductive monocrystalline silicon wafer is thinned to a thickness of 5 μm to 100 μm. In some embodiments, in step 1-b), the n-type conductive monocrystalline silicon wafer is attached onto the transparent insulating substrate by a thermal oxidation process.

In some embodiments, in step 2), the insulating template has a thickness ranging from 300 μm to 1500 μm, and is a transparent sapphire template, a diamond template, or a gallium oxide template; and the square of through hole units in the insulating template has a side length (i.e., a) of less than or equal to 10 μm, and the circular through holes have a diameter of 0.05 Å to 0.4 Å.

In some embodiments, in step 3-b), the protective layer is formed on the n-type conductive monocrystalline silicon wafer by spin-coating a photoresist or depositing a metal layer.

In some embodiments, in step 3-c), the resistivity of the n-type conductive monocrystalline silicon wafer is increased to greater than $1\times10^6$ ohm cm by the ion implantation.

In some embodiments, in step 4-d), the areas of the monocrystalline graphene corresponding to the red-light region through holes are thinned to a thickness of 3 to 5 atomic layers.

In some embodiments, in step 5), the vertical-structure all-nitride material includes n-type GaN, an MQW structure, and p-type GaN, wherein the n-type GaN has a thickness ranging from 100 nm to 2000 nm, with an electron concentration greater than $1\times10^{19}$ cm$^{-3}$; the number of periods in the MQW structure is greater than 3, each period includes a GaN potential barrier and an InGaN potential well, an undoped GaN potential barrier has a thickness greater than 10 nm, and an undoped InGaN well has a thickness ranging from 1.5 nm to 3.5 nm; the p-type GaN has a thickness ranging from 100 nm to 2000 nm, with a hole concentration greater than $3\times10^{18}$ cm$^{-3}$. In some embodiments, in step 5), blue-light-emitting micro-LEDs with a central emission wavelength ranging from 450 nm to 480 nm are obtained on the blue-region graphene array elements; green-light-emitting micro-LEDs with a central emission wavelength ranging from 530 nm to 560 nm are obtained on the green-region graphene array elements; and red-light-emitting micro-LEDs with a central emission wavelength ranging from 610 nm to 640 nm are obtained on the red-region graphene array elements. In some embodiments, in step 5), no vertical structure all-nitride materialis are deposited on insulating-region graphene array elements, forming areas without micro-LEDs. In vertical-structure red/green/blue-light-emitting micro-LEDs have hexagonal pillar structures with the same crystal orientation, having a hexagonal plane shape with a side length of a/2 and a height ranging from 500 nm to 2000 nm, and include three layers: from bottom to top, an n-type GaN layer, an InGaN/GaN MQW structure, and a p-type GaN layer.

In some embodiments, in step 6), the in-situ passivation packaging technology includes depositing a polycrystalline insulating nitride film with a thickness of 20 nm to 50 nm on sidewalls of each micrometer-sized pillar in the full-color micro-LED array and on upper surfaces of the insulating-region graphene array elements through masking and physical vapor deposition, wherein the polycrystalline insulating nitride film has a bandgap greater than 5.0 eV and a resistivity greater than $1\times10^6$ ohm·cm. In some embodiments, filling the gaps in the micro-LED array by using the total internal reflection metal packaging technology includes filling gaps among the micrometer-sized pillars of the blue-light-emitting micro-LED, the green-light-emitting micro-LED, and the red-light-emitting micro-LED in each micro-LED pixel unit with an organic substance, wherein a filling height is equal to a height of the blue-light-emitting micro-LED, the green-light-emitting micro-LED, and the red-light-emitting micro-LED, there is no height variations, and top surfaces of the blue-light-emitting micro-LED, the green-light-emitting micro-LED, and the red-light-emitting micro-LED in each micro-LED pixel unit are exposed, allowing for top light emission while preventing light emission from sidewalls of blue-light-emitting micro-LEDs, green-light-emitting micro-LEDs, and red-light-emitting micro-LEDs.

In some embodiments, in step 7), preparing the transparent electrode includes the following steps:

7-a) acid-etching the flat full-color micro-LED array wafer to separate a lower surface of the n-type conductive monocrystalline silicon wafer from the transparent insulating substrate, and smoothing the lower surface of the n-type conductive monocrystalline silicon wafer;

7-b) spin-coating a transparent electrode on an upper surface of the flat full-color micro-LED array wafer;

7-c) covering a surface of the transparent electrode with the insulating template, wherein the circular through holes of the insulating template are respectively aligned with each of blue-light-emitting micro-LEDs, green-light-emitting micro-LEDs, and red-light-emitting micro-LEDs;

7-d) preparing a protective layer on the insulating template, such that the protective layer is formed on the transparent electrode in areas that correspond to the circular through holes of the insulating template, while no protective layer is formed in areas that do not correspond to the circular through holes;

7-e) removing the insulating template, and performing ion implantation on the transparent electrode, wherein ions are implanted into areas of the transparent electrode which are not covered by the protective layer, such that the areas of the transparent electrode that do not correspond to the blue-light-emitting micro-LEDs, the green-light-emitting micro-LEDs, and the red-light-emitting micro-LEDs have increased resistivity and become electrically insulating;

7-f) overlaying an aluminum array having a complementary pattern to the insulating template on the drive circuit board, the aluminum array being a columnar array, heating to a temperature of 500° C. to 600° C. and holding for 3 to 5 minutes, to attach the aluminum array onto an upper surface of the drive circuit board; and 7-g) attaching the upper surface of the drive circuit board, with the aluminum array thereon, to the lower surface of the n-type conductive monocrystalline silicon wafer, wherein the aluminum array is conductive and reflective, allowing all light to emit from the top surface.

The present disclosure has the advantages:

The present disclosure achieves one-time epitaxial growth of a small-sized vertical-structure nitride micro-LED array of blue, green, and red colors, with a predefined shape and arrangement rule, on a customized template graphene substrate. This eliminates the need for additional micro-nano processing for conversion from LED wafers to micro-LED devices. The method according to present disclosure is energy-saving and environmentally friendly, and is suitable for mass production. The top light emission of product is highly oriented.

BRIEF DESCRIPTION OF THE DRAWINGS

FIG. 6 shows a flowchart of the method for monolithic integration preparation of a full-color nitride semiconductor micro-LED array according to an embodiment of the present disclosure.

DETAILED DESCRIPTION OF THE EMBODIMENTS

The present disclosure will be further described below by means of particular examples with reference to the accompanying drawings.

As shown in FIG. 6, a method for monolithic integration preparation of a full-color nitride semiconductor micro-LED array was performed as follow in this example:

1) Preparation of a composite conductive substrate:
1-a) A sapphire substrate was provided to serve as a transparent insulating substrate 3, wherein the sapphire substrate had a bandgap greater than 5.0 eV and did not absorb ultraviolet light with a wavelength greater than 250 nm.
1-b) An n-type conductive monocrystalline silicon wafer 2 with a thickness of 430 micrometers, a size of 4 inches, and a resistivity less than 0.001 ohm cm was provided, wherein an outer periphery of the n-type conductive monocrystalline silicon wafer had a same shape as an outer periphery of the transparent insulating substrate: polishing was performed on one side of the n-type conductive monocrystalline silicon wafer until a surface roughness of 0.2 nm was achieved on its upper surface: a non-polished surface of the n-type conductive monocrystalline silicon wafer was thinned to 5 μm, and the n-type conductive monocrystalline silicon wafer was attached onto the transparent insulating substrate, with the polished surface facing upwards, to form the composite conductive substrate 1.

2) Provision of an insulating template:
The insulating template was a flat panel made of an electrically insulating material. An outer periphery of the insulating template had a same shape as an outer periphery of the composite conductive substrate. The insulating template was divided into a plurality of two-dimensional closely arranged through hole units. An outer periphery of each through hole unit was in a square plane shape with a side length (i.e., a) of 5 μm. Each through hole unit included four circular through holes inside with a depth equal to a thickness of the insulating template and a diameter of 0.2a (i.e., 1 μm), namely, one green-light region through hole, one blue-light region through hole, and two red-light region through holes. The green-light region through hole and the blue-light region through hole were respectively located at a pair of diagonal corners of the square, and the two red-light region through holes were respectively located at the other pair of diagonal corners of the square.

Figure 1:
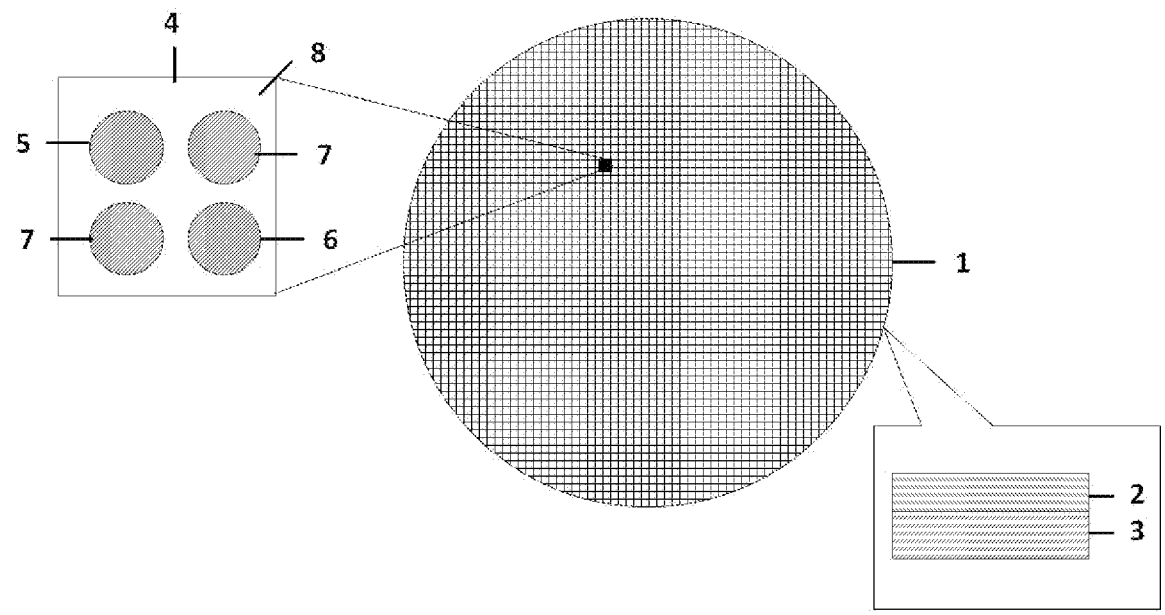
FIG. 1 shows a schematic diagram of a template substrate obtained in the method for monolithic integration preparation of a full-color nitride semiconductor micro-LED array according to an embodiment of the present disclosure.

3) Preparation of a template substrate:
3-a) The insulating template was overlaid onto the composite conductive substrate in a completely aligned manner.
3-b) The insulating template was spin-coated with a photoresist to prepare a protective layer, such that the protective layer was formed on the n-type conductive monocrystalline silicon wafer in areas corresponding to the circular through holes of the insulating template, while no protective layer was formed in areas not corresponding to the circular through holes.
3-c) The insulating template was removed, and ion implantation was performed on the n-type conductive monocrystalline silicon wafer, such that ions were implanted into areas of the n-type conductive monocrystalline silicon wafer which were not covered by the protective layer, thereby increasing resistivity and making these areas electrically insulating, and then the insulating template was removed.
3-d) Chemical cleaning was performed on the composite conductive substrate after ion implantation to remove the protective layer, wherein the areas corresponding to the circular through holes of the insulating template remained conductive, while remaining areas became electrically insulating, thus completing modification of the n-type conductive monocrystalline silicon wafer to obtain the template substrate.
3-e) Corresponding to the insulating template, a plurality of closely arranged two-dimensional pixel regions 4 were provided on the n-type conductive monocrystalline silicon wafer of the template substrate, wherein each pixel region 4 included four circular conductive regions, namely, two red-light conductive regions 7, one green-light conductive region 6, and one blue-light conductive region 5, and the rest being an insulating region 8, as shown in FIG. 1.

4) Preparation of a customized template graphene substrate:
4-a) Monocrystalline graphene with a thickness of 6 atomic layers and a size of 4 inches was provided, wherein an outer periphery of the monocrystalline graphene had a same shape as the template substrate.
4-b) The monocrystalline grapheme was overlaid onto the template substrate in a completely aligned manner.

4-c) The insulating template was overlaid onto the monocrystalline graphene in a completely aligned manner, wherein one green-light region through hole, one blue-light region through hole, and two red-light region through holes of each through hole unit of the insulating template were respectively precisely aligned with the one green-light conductive region, the one blue-light conductive region, and the two red-light conductive regions of in each pixel region of the n-type conductive monocrystalline silicon wafer.

4-d) The monocrystalline grapheme was thinned in areas corresponding to the blue-light region through holes and green-light region through holes, until a thickness of one atomic layer was achieved, and the monocrystalline graphene was thinned in areas corresponding to the red-light region through holes, until a thickness of 4 atomic layers was achieved.

4-e) Uniform nitrogen atom doping was performed on the monocrystalline graphene in areas corresponding to the blue-light region through holes, green-light region through holes, and red-light region through holes, wherein the monocrystalline graphene after the uniform nitrogen atom doping exhibits ultraviolet absorption within a range of 240 to 270 nm.

4-f) A pseudo-monocrystalline AlON layer with a thickness of 5 nm was deposited on the monocrystalline graphene in areas corresponding to the blue-light region through holes, such that a nitride epitaxial layer grown thereon had a metal lattice polarity.

Figure 2:
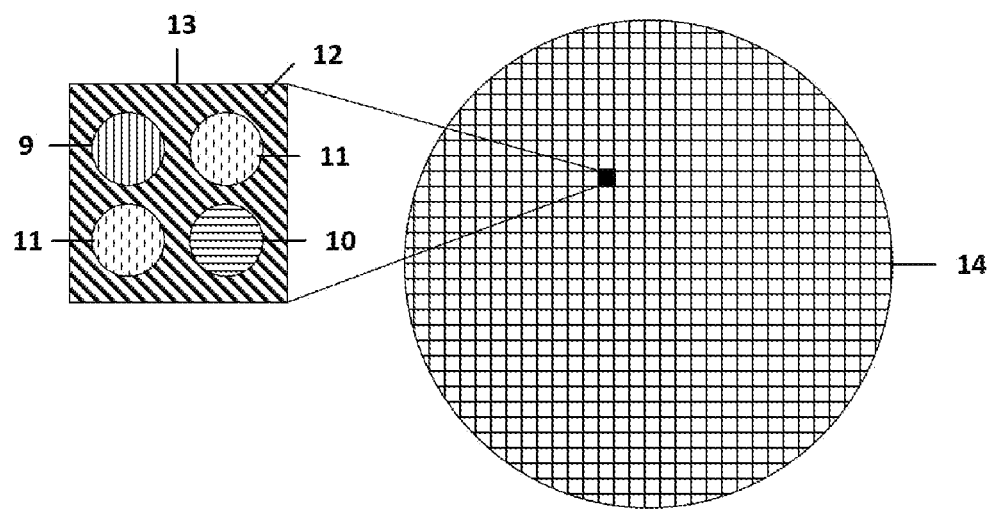
FIG. 2 shows a schematic diagram of a customized template graphene substrate obtained in the method for monolithic integration preparation of a full-color nitride semiconductor micro-LED array according to an embodiment of the present disclosure.

4-g) Edges of the monocrystalline graphene that correspond to the green-light region through holes, blue-light region through holes, and red-light region through holes was cut by using ultraviolet laser with a wavelength of 255 nm, wherein the cutting was performed only on the monocrystalline graphene: blue-region graphene array elements, green-region graphene array elements, and red-region graphene array elements were formed on the monocrystalline graphene in areas respectively corresponding to the blue-light region through holes, green-light region through holes, and red-light region through holes, and insulating-region graphene array elements were formed among the blue-region graphene array elements, green-region graphene array elements, and red-region graphene array elements, thereby forming graphene array units 13 each consisting of one blue-region graphene array element 9, one green-region graphene array element 10, two red-region graphene array elements 11, and an insulating-region graphene array element 12. The insulating template was removed to obtain a customized template graphene substrate 14, wherein the blue-region graphene array element, the green-region graphene array element, and the red-region graphene array elements in each graphene array unit 13 on the n-type conductive monocrystalline silicon wafer of the customized template graphene substrate have surface properties different from each other, as shown in FIG. 2.

Figure 3:
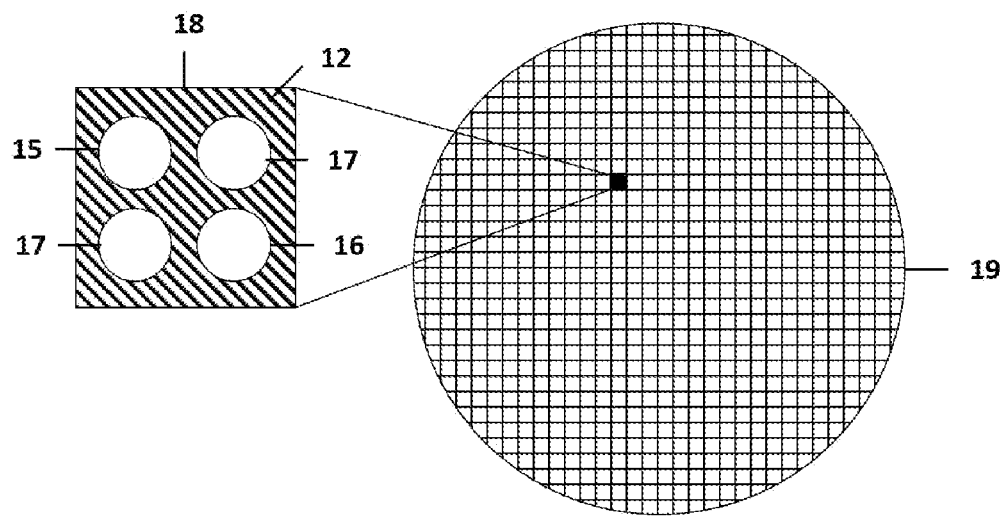
FIG. 3 shows a schematic diagram of a full-color micro-LED array epitaxial wafer obtained in the method for monolithic integration preparation of a full-color nitride semiconductor micro-LED array according to an embodiment of the present disclosure.

5) Preparation of a full-color micro-LED array epitaxial wafer:

The customized template graphene substrate was placed into a metal organic chemical vapor deposition system, and vertical-structure all-nitride micro-LEDs were formed by deposition, which had the following structure: silicon-doped n-type GaN (with an electron concentration of $3\times10^{19}$ cm$^{-3}$) with a thickness of 300 nm, an deposited InGaN/GaN multiple-quantum-well structure with 5 periods (in each structure, undoped GaN with a thickness of 15 nm served as a potential barrier and undoped InGaN with a thickness of 2.5 nm served as a potential well, and the structure had a total thickness of 102.5 nm), and deposited magnesium-doped p-type GaN (with a hole concentration of $3\times10^{19}$ cm$^{-3}$) with a thickness of 300 nm. Due to the different surface properties of the blue-region graphene array element, green-region graphene array element, and red-region graphene array elements of each graphene array unit on the n-type conductive monocrystalline silicon wafer of the customized template graphene substrate, the vertical-structure all-nitride materials grown thereon had different lattice polarities, stress states, and In compositions in the MQW structures, and thereby different central emission wavelengths, and therefore a vertical-structure monocrystalline metal-polar blue-light-emitting nitride, a vertical-structure monocrystalline nitrogen-polar green-light-emitting nitride, and a vertical-structure monocrystalline stress-relaxed nitrogen-polar red-light-emitting nitride were grown respectively on the blue-region graphene array elements, green-region graphene array elements, and red-region graphene array elements, to form a blue-light-emitting micro-LED 15, a green-light-emitting micro-LED 16, and a red-light-emitting micro-LED 17, as well as areas without micro-LEDs, which constituted a micro-LED pixel unit 18 emitting light in multiple directions. The full-color micro-LED array epitaxial wafer 19 was obtained by one-step in-situ process, and the blue, green, and red-light-emitting micro-LEDs were micrometer-sized pillars. The MQW structure in the vertical-structure monocrystalline metal-polar blue-light-emitting nitride located on the blue-region graphene array elements had 16% of In composition, and the central emission wavelength of the blue-light-emitting micro-LED 15 was approximately 459 nm. The MQW structure in the vertical-structure monocrystalline nitrogen-polar green-light nitride located on the green-region graphene array elements had 26% of In composition, and the central emission wavelength of the green-light-emitting micro-LED 16 was approximately 536 nm. The MQW structure in the vertical-structure monocrystalline stress-relaxed nitrogen-polar red-light-emitting nitride located on the red-region graphene array elements had 35% of In composition, and the central emission wavelength of the red-light-emitting micro-LED 17 was approximately 620 nm, as shown in FIG. 3.

Figure 4:
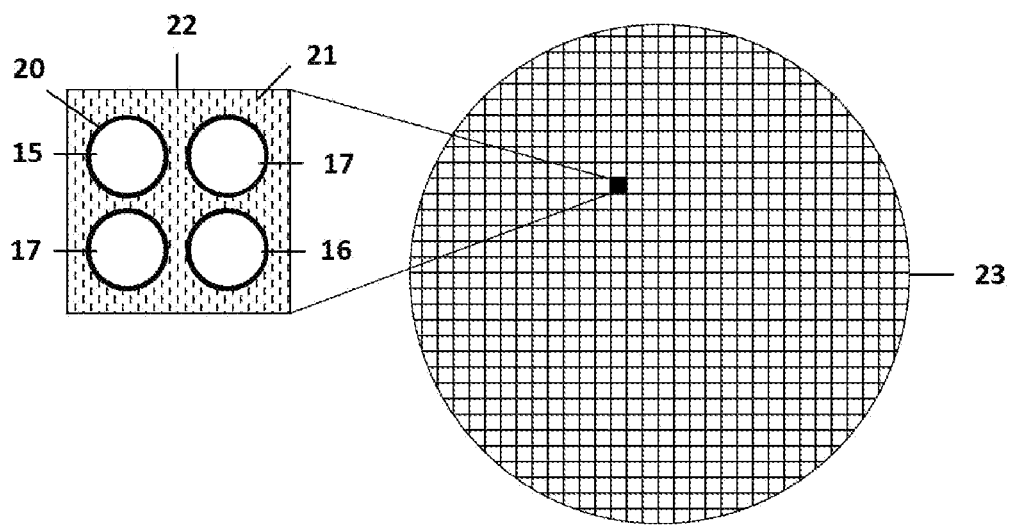
FIG. 4 shows a schematic diagram of a flat full-color micro-LED array wafer obtained in the method for monolithic integration preparation of a full-color nitride semiconductor micro-LED array according to an embodiment of the present disclosure.

6) Packaging:

An AlN film with a thickness of 20 to 50 nm was deposited on sidewalls of each micrometer-sized pillar in the full-color micro-LED array and on an upper surface of the insulating region through masking and physical vapor deposition to form a polycrystalline insulating nitride film 20, wherein the polycrystalline insulating nitride film had a bandgap greater than 5.0 eV and a resistivity greater than $1\times10^6$ ohm cm. A polycrystalline Al film with a thickness of 30 nm was deposited using a total internal reflection metal packaging technology. Gaps among the micrometer-sized pillars of the blue, green, and red-light-emitting micro-LEDs were filled with polymethyl methacrylate 21, wherein a filling height was equal to a height of the blue, green, and red-light-emitting micro-LEDs, there was no height variation, and top surfaces of the blue, green, and red-light-emitting micro-LEDs were exposed. Light emission from sidewalls of the blue, green, and red-light-emitting micro-LEDs was prevented, while only light emission in a direction vertical to the top surface was allowed. The micro-LED pixel units 18 emitting light in multiple directions was transformed into micro-LED pixel units 22 emitting light only in the vertical direction, thereby obtaining a flat full-color micro-LED array wafer 23, as shown in FIG. 4.

7) Preparation of a transparent electrode:

7-a) The flat micro-LED array wafer was acid-etched to separate a lower surface of the n-type conductive monocrystalline silicon wafer from the transparent insulating substrate 3, and the lower surface of the n-type conductive monocrystalline silicon wafer was smoothed.

7-b) An upper surface of the flat micro-LED array wafer was spin-coated with indium tin oxide having a thickness of 50 to 500 nm to form the transparent electrode.

7-c) A surface of the transparent electrode was covered with the insulating template, wherein the circular through holes of the insulating template were respectively aligned with each of blue, green, and red-light-emitting micro-LEDs.

7-d) The insulating template was spin-coated with a photoresist to prepare a protective layer, such that the protective layer was formed within the circular through holes of the insulating template, while no protective layer was formed in areas without the circular through boles.

7-e) The insulating template was removed, and ion implantation was performed on the transparent electrode, wherein ions were implanted into areas of the transparent electrode which were not covered by the protective layer, such that the areas of the transparent electrode that did not correspond to the blue, green, and red-light-emitting micro-LEDs had increased resistivity and became electrically insulating. This achieved a transparent electrode array on top surfaces of the blue, green, and red-light-emitting micro-LEDs. A single vertically-emitting micro-LED pixel unit 28 with a transparent electrode included a conductive blue region 24 above the blue-light-emitting micro-LED, a conductive green region 25 above the green-light-emitting micro-LED, a conductive red region 26 above the red-light-emitting micro-LED, and a non-conductive insulating region 27 among the conductive blue region, conductive green region, and conductive red region.

7-f) The drive circuit board 30 was covered with an aluminum array having a complementary pattern to the insulating template, the aluminum array being a columnar array. The columnar aluminum array had a diameter of 5 μm and a thickness of 20 nm. A position of the aluminum array corresponded to that of the electrode array on the drive circuit board, and the electrode array on the driving circuit board also had a diameter of 5 μm. Vapor deposition was performed using techniques such as magnetron sputtering. Heating was performed to reach a temperature of 500° C. to 600° C., which was held for 3 to 5 minutes, to attach the aluminum array onto an upper surface of the drive circuit board.

Figure 5:
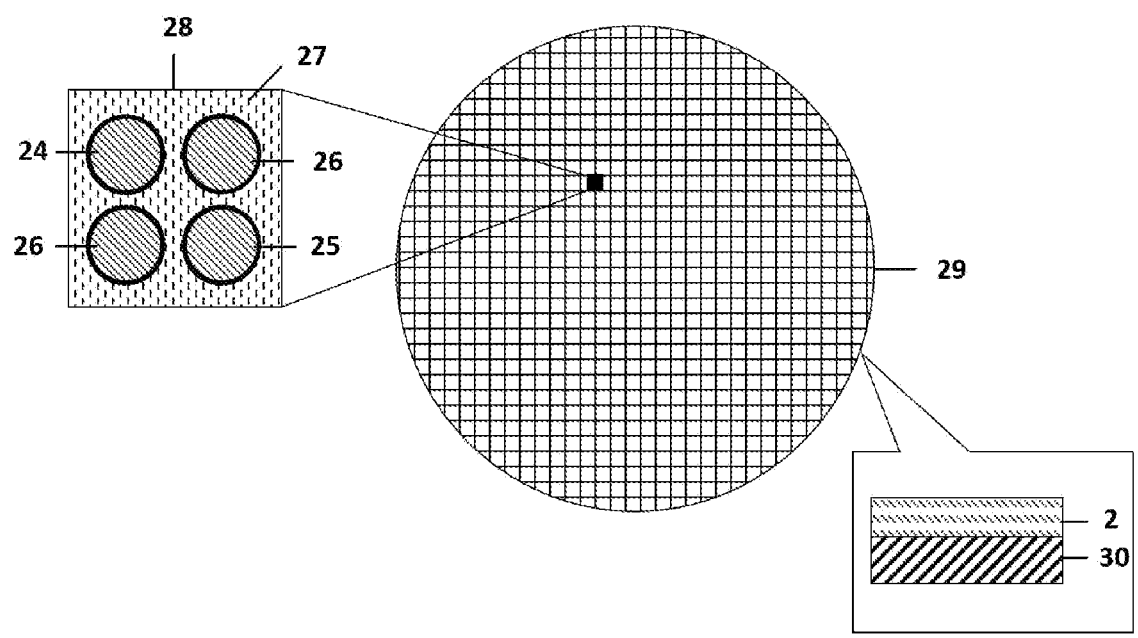
FIG. 5 shows a schematic diagram of a vertical-structure full-color nitride semiconductor micro-LED array with top light emission obtained by the method for monolithic integration preparation of a full-color nitride semiconductor micro-LED array according to an embodiment of the present disclosure.

7-g) The upper surface of the drive circuit board, with the aluminum array thereon, was attached to the lower surface of the n-type conductive monocrystalline silicon wafer, wherein the aluminum array was conductive and reflective, preventing light emission from the bottom surface while achieving electrode bonding on the bottom surface, such that all light was emitted from the top surface, to obtain a vertical-structure full-color nitride micro-LED array 29 with top light emission, as shown in FIG. 5.

Finally, it should be noted that disclosure of the embodiments is intended to help further understand the present disclosure. However, those skilled in the art can understand that various substitutions and modifications may be made without departing from the spirit and scope of the present disclosure and the appended claims. Therefore, the present disclosure should not be limited to the content disclosed in the embodiments, and the scope of protection claimed by the present disclosure is subject to the scope defined by the claims.

What is claimed is:

1. A method for monolithic integration preparation of a full-color nitride semiconductor micro light-emitting diode (micro-LED) array, comprising the steps of 1) preparing a composite conductive substrate, comprising:

1-a) providing a transparent insulating substrate, wherein a material for the transparent insulating substrate has a bandgap greater than 5.0 eV and does not absorb ultraviolet light with a wavelength greater than 250 nm; and 1-b) providing an n-type conductive monocrystalline silicon wafer with a resistivity less than 0.01 ohm·cm; performing polishing on one side of the n-type conductive monocrystalline silicon wafer to form a polished surface, thinning a non-polished surface of the n-type conductive monocrystalline silicon wafer, and attaching the n-type conductive monocrystalline silicon wafer onto the transparent insulating substrate, with the polished surface facing upwards, to form the composite conductive substrate, wherein an outer periphery of the n-type conductive monocrystalline silicon wafer has a same shape as an outer periphery of the transparent insulating substrate;

2) providing an insulating template, wherein the insulating template is a flat panel made of an electrically insulating material; an outer periphery of the insulating template has a same shape as an outer periphery of the composite conductive substrate; the insulating template is divided into a plurality of through hole units that are arranged closely in a two-dimensional manner; an outer periphery of each of the through hole units is in a plane shape of square; each of the through hole units comprises four circular through holes inside with a depth equal to a thickness of the insulating template, namely, one green-light region through hole, one blue-light region through hole, and two red-light region through holes; the green-light region through hole and the blue-light region through hole are respectively located at a pair of diagonal corners of the square, and the two red-light region through holes are respectively located at the other pair of diagonal corners of the square;

3) preparing a template substrate, comprising:

3-a) overlaying the insulating template onto the composite conductive substrate in a completely aligned manner;

3-b) preparing a protective layer on the insulating template, such that the protective layer is formed on the n-type conductive monocrystalline silicon wafer in areas corresponding to the circular through holes of the insulating template, while no protective layer is formed in areas not corresponding to the circular through holes of the insulating template;

3-c) removing the insulating template, and performing ion implantation on the n-type conductive monocrystalline silicon wafer, such that ions are implanted into the areas of the n-type conductive monocrystalline silicon wafer which are not covered by the protective layer, thereby increasing resistivity and making the areas electrically insulating;

3-d) performing chemical cleaning on the composite conductive substrate after ion implantation to remove the protective layer, wherein the areas corresponding to the circular through holes of the insulating template remain conductive, while remaining areas become electrically insulating, thus completing modification of the n-type conductive monocrystalline silicon wafer to obtain the template substrate; and 3-e) corresponding to the insulating template, providing a plurality of pixel regions arranged closely in a two-dimensional manner on the n-type conductive monocrystalline silicon wafer of the template substrate, wherein each of the pixel regions comprises four circular conductive regions, namely, two red-light conductive regions, one green-light conductive region, and one blue-light conductive region, and the rest being an insulating region;

4) preparing a customized template graphene substrate, comprising 4-a) providing monocrystalline graphene, wherein an outer periphery of the monocrystalline graphene has a same shape as the template substrate, and the monocrystalline graphene has a thickness of 3 to 6 atomic layers;

4-b) overlaying the monocrystalline graphene onto the template substrate in a completely aligned manner;

4-c) overlaying the insulating template onto the monocrystalline graphene in a completely aligned manner, wherein the one green-light region through hole, the one blue-light region through hole, and the two red-light region through holes in each of the through hole units of the insulating template are respectively precisely aligned with the one green-light conductive region, the one blue-light conductive region, and the two red-light conductive regions in each of the pixel regions of the n-type conductive monocrystalline silicon wafer;

4-d) thinning the monocrystalline graphene in areas corresponding to blue-light region through holes and green-light region through holes, until the areas have a thickness of one atomic layer;

4-e) performing uniform nitrogen atom doping on the monocrystalline graphene in areas corresponding to the blue-light region through holes, the green-light region through holes, and red-light region through holes, wherein the monocrystalline graphene after the uniform nitrogen atom doping exhibits ultraviolet absorption within a range of 240 nm to 270 nm;

4-f) depositing an AlON layer on the monocrystalline graphene in areas corresponding to the blue-light region through holes, such that a nitride epitaxial layer grown thereon has a metal lattice polarity; and 4-g) cutting edges of the monocrystalline graphene that correspond to the blue-light region through holes, the green-light region through holes, and the red-light region through holes of the insulating template, wherein the cutting is performed only on the monocrystalline graphene; and removing the insulating template to obtain the customized template graphene substrate, wherein blue-region graphene array elements, green-region graphene array elements, and red-region graphene array elements are formed on the monocrystalline graphene in areas respectively corresponding to the blue-light region through holes, the green-light region through holes, and the red-light region through holes, and an insulating-region graphene array element is formed among the blue-region graphene array elements, the green-region graphene array elements, and the red-region graphene array elements, thereby forming graphene array units each comprising one blue-region graphene array element, one green-region graphene array element, two red-region graphene array elements, and an insulating-region graphene array element; and wherein the one blue-region graphene array element, the one green-region graphene array element, and the two red-region graphene array elements in each of the graphene array units on the n-type conductive monocrystalline silicon wafer of the customized template graphene substrate have surface properties different from each other;

5) preparing a full-color micro-LED array epitaxial wafer, comprising placing the customized template graphene substrate into a metal organic chemical vapor deposition system, epitaxially growing a vertical-structure all-nitride material on the customized template graphene substrate through one-step in-situ process, thereby obtaining the full-color micro-LED array epitaxial wafer through the one-step in-situ process, wherein a multiple quantum well (MQW) of the vertical-structure all-nitride material comprises multiple periods of InGaN potential wells and GaN potential barriers;

due to the different surface properties of the blue-region graphene array elements, the green-region graphene array elements, and the red-region graphene array elements on the customized template graphene substrate, vertical-structure all-nitride materials grown thereon have different lattice polarities, stress states, and In compositions in MQW structures, and thereby different central emission wavelengths, and therefore a vertical-structure monocrystalline metal-polar blue-light-emitting nitride, a vertical-structure monocrystalline nitrogen-polar green-light-emitting nitride, and a vertical-structure monocrystalline stress-relaxed nitrogen-polar red-light-emitting nitride are grown respectively on the blue-region graphene array elements, the green-region graphene array elements, and the red-region graphene array elements, to form a blue-light-emitting micro-LED, a green-light-emitting micro-LED, and a red-light-emitting micro-LED, as well as an area without micro-LEDs, which constitute a micro-LED pixel unit; and the blue-light-emitting micro-LED, the green-light-emitting micro-LED, and the red-light-emitting micro-LED are micrometer-sized pillars;

6) packaging, comprising providing sidewall protection for the full-color micro-LED array epitaxial wafer by using an in-situ passivation packaging technology, and filling gaps in the full-color micro-LED array by using an in-situ total internal reflection metal packaging technology, to obtain a flat full-color micro-LED array wafer; and 7) preparing a transparent electrode, comprising
preparing the transparent electrode on a surface of the flat full-color micro-LED array wafer by using a mask deposition method, and bonding the flat full-color micro-LED array wafer onto a drive circuit board by using a bottom electrode bonding technology, to achieve a vertical-structure full-color nitride micro-LED array with top light emission.

2. The method as claimed in claim 1, wherein in step 1-a), the transparent insulating substrate is one selected from the group consisting of a sapphire substrate, a diamond substrate, and a gallium oxide substrate, and has a thickness ranging from 300 μm to 1500 μm.

3. The method as claimed in claim 1, wherein in step 1-b), the n-type conductive monocrystalline silicon wafer has a thickness ranging from 300 μm to 1500 μm and a diameter ranging from 50 mm to 300 mm;
the polished surface of the n-type conductive monocrystalline silicon wafer has a surface roughness of less than 0.5 nm; and
the non-polished surface of the n-type conductive monocrystalline silicon wafer is thinned to a thickness of 5 μm to 100 μm.

4. The method as claimed in claim 1, wherein in step 2), the insulating template has a thickness ranging from 300 μm to 1500 μm, and is a transparent sapphire template, a diamond template, or a gallium oxide template; and
the square of each of the through hole units in the insulating template has a side length of less than or equal to 10 μm, and the circular through holes each have a diameter of 0.05 Å to 0.4 Å.

5. The method as claimed in claim 1, wherein in step 3-b), the protective layer is formed on the n-type conductive monocrystalline silicon wafer by spin-coating a photoresist or depositing a metal layer.

6. The method as claimed in claim 1, wherein in step 3-c), the resistivity of the n-type conductive monocrystalline silicon wafer is increased to greater than $1\times10^6$ ohm·cm by the ion implantation.

7. The method as claimed in claim 1, wherein in step 4-d), the areas of the monocrystalline graphene corresponding to the red-light region through-holes are thinned to a thickness of 3 to 5 atomic layers.

8. The method as claimed in claim 1, wherein in step 5), blue-light-emitting micro-LEDs with a central emission wavelength ranging from 450 nm to 480 nm are obtained on the blue-region graphene array elements;
green-light-emitting micro-LEDs with a central emission wavelength ranging from 530 nm to 560 nm are obtained on the green-region graphene array elements; and
red-light-emitting micro-LEDs with a central emission wavelength ranging from 610 nm to 640 nm are obtained on the red-region graphene array elements.

9. The method as claimed in claim 1, wherein in step 6), filling the gaps in the micro-LED array by using the total internal reflection metal packaging technology comprises filling gaps among the micrometer-sized pillars of the blue-light-emitting micro-LED, the green-light-emitting micro-LED, and the red-light-emitting micro-LED in each micro-LED pixel unit with an organic substance, wherein a filling height is equal to a height of the blue-light-emitting micro-LED, the green-light-emitting micro-LED, and the red-light-emitting micro-LED, there is no height variations, and top surfaces of the blue-light-emitting micro-LED, the green-light-emitting micro-LED, and the red-light-emitting micro-LED in each micro-LED pixel unit are exposed, allowing for top light emission while preventing light emission from sidewalls of blue-light-emitting micro-LEDs, green-light-emitting micro-LEDs, and red-light-emitting micro-LEDs.

10. The method as claimed in claim 1, wherein in step 7), preparing the transparent electrode comprises the steps of
7-a) acid-etching the flat full-color micro-LED array wafer to separate a lower surface of the n-type conductive monocrystalline silicon wafer from the transparent insulating substrate, and smoothing the lower surface of the n-type conductive monocrystalline silicon wafer;
7-b) spin-coating a transparent electrode on an upper surface of the flat full-color micro-LED array wafer;
7-c) covering a surface of the transparent electrode with the insulating template, wherein the circular through holes of the insulating template are respectively aligned with each of blue-light-emitting micro-LEDs, green-light-emitting micro-LEDs, and red-light-emitting micro-LEDs;
7-d) preparing a protective layer on the insulating template, such that the protective layer is formed on the transparent electrode in areas that correspond to the circular through holes of the insulating template, while no protective layer is formed in areas that do not correspond to the circular through holes;
7-e) removing the insulating template, and performing ion implantation on the transparent electrode, wherein ions are implanted into areas of the transparent electrode which are not covered by the protective layer, such that the areas of the transparent electrode that do not correspond to the blue-light-emitting micro-LEDs, the green-light-emitting micro-LEDs, and the red-light-emitting micro-LEDs have increased resistivity and become electrically insulating;
7-f) overlaying an aluminum array having a complementary pattern to the insulating template on the drive circuit board, the aluminum array being a columnar array, heating to a temperature of 500° C. to 600° C. and holding for 3 to 5 minutes, to attach the aluminum array onto an upper surface of the drive circuit board; and
7-g) attaching the upper surface of the drive circuit board, with the aluminum array thereon, to the lower surface of the n-type conductive monocrystalline silicon wafer, wherein the aluminum array is conductive and reflective, allowing all light to emit from the top surface.

* * * * *